United States Patent
Foster et al.

(10) Patent No.: US 10,453,383 B2
(45) Date of Patent: Oct. 22, 2019

(54) DISPLAY PANEL HAVING A SEALED BACK COVER

(71) Applicant: Ultravision Technologies, LLC, Dallas, TX (US)

(72) Inventors: Matthew Foster, Flower Mound, TX (US); William Y. Hall, Dallas, TX (US)

(73) Assignee: ULTRAVISION TECHNOLOGIES, LLC, Dallas, TX (US)

( * ) Notice: Subject to any disclaimer, the term of this patent is extended or adjusted under 35 U.S.C. 154(b) by 0 days.

(21) Appl. No.: 15/727,127

(22) Filed: Oct. 6, 2017

(65) Prior Publication Data
US 2019/0108784 A1    Apr. 11, 2019

(51) Int. Cl.
| | |
|---|---|
| *G06F 3/14* | (2006.01) |
| *G09G 3/32* | (2016.01) |
| *H05K 3/30* | (2006.01) |
| *H05K 5/03* | (2006.01) |
| *H05K 5/02* | (2006.01) |

(52) U.S. Cl.
CPC .............. *G09G 3/32* (2013.01); *G06F 3/1446* (2013.01); *H05K 3/301* (2013.01); *H05K 5/0247* (2013.01); *H05K 5/03* (2013.01); *G09G 2330/021* (2013.01)

(58) Field of Classification Search
CPC .............. G09G 3/32–3208; G06F 3/1446
See application file for complete search history.

(56) References Cited

U.S. PATENT DOCUMENTS

| | | | | |
|---|---|---|---|---|
| 2008/0009145 | A1* | 1/2008 | Zhou | H01R 13/6658 439/55 |
| 2015/0185791 | A1* | 7/2015 | Hall | G06F 3/1446 361/679.21 |
| 2017/0083273 | A1* | 3/2017 | Kim | G06F 3/1446 |

FOREIGN PATENT DOCUMENTS

| | | |
|---|---|---|
| CN | 102930785 A | 2/2013 |
| CN | 203607050 U | 5/2014 |

OTHER PUBLICATIONS

Cirrus LED Systems, Internet Archive Wayback Machine, "The N2 System Setup & Installation ZERO Lead Time," Outdoor LED Displays—Cirrus LED Systems, https://web.archive.org/web/20131228140224/http://cirrusled.com/, Dec. 28, 2013, 4 Pages.

(Continued)

*Primary Examiner* — Hang Lin
(74) *Attorney, Agent, or Firm* — Slater Matsil, LLP

(57) ABSTRACT

An embodiment display panel may include a housing including a recess, a substrate disposed in the recess, and a plurality of light emitting diodes (LEDs) attached to a front side of the substrate, in which the plurality of LEDs form a front surface of the display panel. The display panel may further include a back cover enclosing the recess and a back side of the substrate. The back cover may form a back surface of the display panel, and the back cover may be configured to prevent ingress of water or dust through a thickness of the back cover. The display panel may further include a power supply disposed in the recess and physically attached to the back cover and not to the housing or substrate, in which the power supply is configured to power the plurality of LEDs.

25 Claims, 14 Drawing Sheets

(56) References Cited

OTHER PUBLICATIONS

Cirrus LED Systems, Internet Archive Wayback Machine, "Introducing N2 System Innovative Outdoor LED Display Solution from Cirrus," LED Panels, N2 System—Cirrus LED System, https://web.archive.org/web/20130921080129/http://www.cirrusled.com/products/n2-system Sep. 21, 2013, 3 Pages.
Cirrus LED, Internet Archive Wayback Machine, "Nubis System the Next Generation Reinventing the LED Display," LED Outdoor Display Signs, Electronic Digital Message Sign Billboards, LED Displays Manufacturer, https://web.archive.org/web/20120213172356/http://www.cirrusled.com:80/, Feb. 13, 2012, 1 Page.
Cirrus N2 LED Displays, Internet Archive Wayback Machine, "LED Panels," Martin Supply Company Inc., https://web.archive.org/web/20130916051706/http://martin-supply.com/category/nubis, Sep. 16, 2013, 2 Pages.
Cirrus LED Systems, Internet Archive Wayback Machine, "The Next Generation of LED Display," Outdoor LED Displays—Cirrus LED Systems, https://web.archive.org/web/20130830230540/http://www.cirrusled.com/, Aug. 30, 2013, 2 pages.
Cirrus LED Systems, Internet Archive Wayback Machine, "N2-19C," 19mm Pixel Pitch LED Sign—Cirrus LED Systems, https://web.archive.org/web/20130921075058/http://www.cirrusled.com/products/n2-system/full-color-rgb/19mm-pixel-pitch-led-sign, Sep. 21, 2013, 2 Pages.
Cirrus Systems, "N2 LED Display System Video," Published on Youtube on Jul. 24, 2013, 62 Pages.
Applicant Admitted Prior Art, Shenzhen Only 19 × 19 Panel, Feb. 17, 2013, pp. 1-20.
Applicant Admitted Prior Art, Shenzhen Only 19 × 19 Panel, Feb. 17, 2013, pp. 21-32.
Applicant Admitted Prior Art, UltraPanel, Dec. 1, 2012, 15 pages.
Barco LiveDots Introduces 14mm Transparent LED Display, Light Sound Journal.com, Jun. 7, 2013, 2 pages.
Barco, Inc., "C11 Lightweight, indoor/outdoor LED video display," company website product technical specification sheet, M00360-R02-0111-DS Jan. 2011, 2 pages, Kortrijk, Belgium.
Barco, Inc., "C8," company website product specification sheet, Dec. 16, 2015, 3 pages.
Barco, Inc., "Barco LiveDots adds new member to its C-series LED display family," company website news press release, Apr. 8, 2013, 3 pages, Kortrijk, Belgium.
Barco, Inc., "PXL System User Manual," Revised Jun. 15, 2010, 196 pages.
Barco, Inc., "Say hello to our brand-new C8 LED display!," company website news press release, Apr. 8, 2013, 3 pages.
Internet Archive Wayback Machine, "Outdoor/Indoor LED Display, LED Screen, LED Panel, LED Video Wall, LED Curtain, LED Strip," https://web.archive.org/web/20130728075831/http://www.szaoto.com:80/product1.html, Jul. 2013, 2 pages.
AOTO, Article "AOTO Launches World Highest Resolution Outdoor LED Display—M8 in ISE 2012," http://en.aoto.com/article/detail/201705111014.html, 2012, 3 pages.
Internet Archive Wayback Machine, "AOTO Launches World's Highest-Resolution M3 LED Display in ISE," https://www.szaoto.com:80/news_23.html, Dec. 11, 2011, 1 page.
Barco, "LED Display Systems," LiveDots Product Catalog 2011, http://web.archive.org/web/20120318082027/http:/www.barco.com/Downloads/liveDots/LED_Product_Catalog.pdf, Mar. 18, 2012, 28 pages.
"C-5 Rental Display," Installation Manual, Nov. 15, 2011, R5905120, 79 pages.
Internet Archive Wayback Machine, AOTO M Series Rental LED Display, "M Series Rental LED Display," https://web.archive.org/web/20111211101926/http://www.szaoto.com:80/product13, Dec. 11, 2011, 1 page.
Internet Archive Wayback Machine, AOTO, "News Center," http://szaoto.com/news.html, Dec. 7, 2013, 2013, 3 pages.
Internet Archive Wayback Machine, "AOTO M Series Rental LED Display," https://web.archive.org/web/20130909053329/http://szaoto.com:80/product13.html, Sep. 2013, 1 page.
Barco, "Outdoor LED Display Solutions," SLite, www.barco.com, Apr. 2007, 4 pages.
SEfl, Glux Visual Effects Tech (Shenzhen) Co., Ltd, http://www.glux.cc/business-provide-self-cysn.html, Oct. 1, 2013, 2 pages.
Glux, "SEfl Series," www.glux.com.cn, 2013, 1 page.
Vuepix, Product Catalog, 2012, www.vuepix.com, 36 pages.
MOtn, Glux Visual Effects Tech (Shenzhen) Co., Ltd, http://www.glux.cc/business-provide-self-cysn.html, Oct. 1, 2013, 2 pages.

* cited by examiner

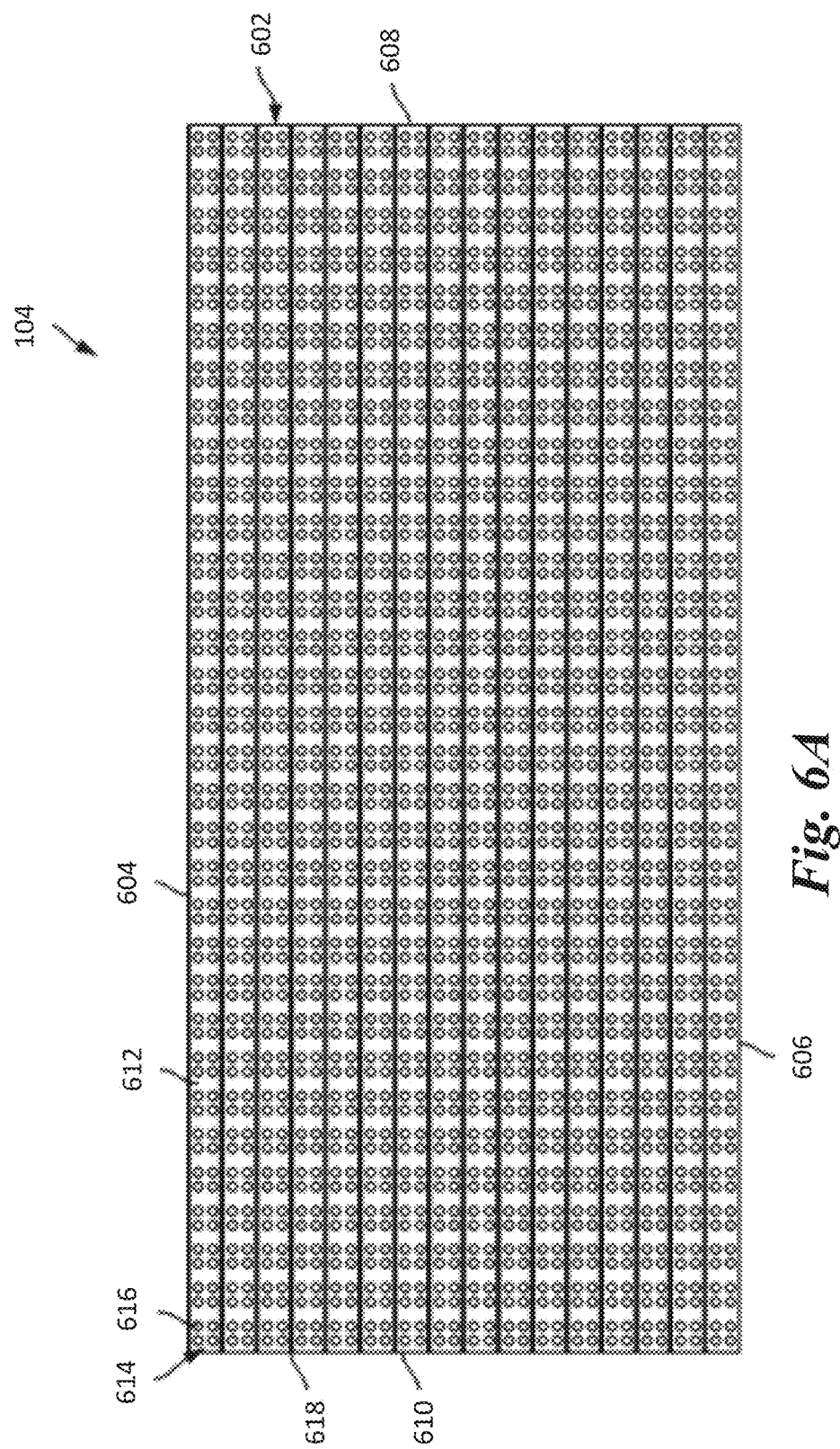

DISPLAY PANEL HAVING A SEALED BACK COVER

TECHNICAL FIELD

The present disclosure relates generally to displays including a plurality of display panels, and, in particular embodiments, to a display panel having a sealed back cover.

BACKGROUND

Large displays (e.g., billboards), such as those commonly used for advertising in cities and along roads, are widely used to display images, video, or text. The graphics may be projected on a single panel or extended across multiple panels. Each panel may have an array of light emitting diodes (LEDs) to generate the visual graphics. The LED panels may be conventional panels made using discrete LEDs or surface-mounted device (SMD) panels. Most outdoor screens and some indoor screens are built around discrete LEDs, which are also known as individually mounted LEDs. A cluster of red, green, and blue diodes, or alternatively, a tri-color diode, is driven together to form a full-color pixel, usually square in shape. These pixels are spaced evenly apart and are measured from center to center for absolute pixel resolution.

Each panel may be powered by a power supply and may include a plastic back or a metal door system that facilitates access to internal circuitry and/or connections to the panel. The panel may also include back-side ventilation (e.g. ventilation slots) that allows for system cooling. However, such back-side ventilation allows ingress of both water and dust into the panel, thereby increasing the likelihood of system failure.

SUMMARY

In an embodiment, a display panel may include a housing including a recess, a substrate disposed in the recess, and a plurality of light emitting diodes (LEDs) attached to a front side of the substrate, in which the plurality of LEDs form a front surface of the display panel. The display panel may further include a back cover enclosing the recess and a back side of the substrate. The back cover may form a back surface of the display panel, and the back cover may be configured to prevent ingress of water or dust through a thickness of the back cover. The display panel may further include a power supply disposed in the recess and physically attached to the back cover and not to the housing or substrate, in which the power supply is configured to power the plurality of LEDs.

In an embodiment, a display panel may include a casing having a recess and attachment points for use in attachment as part of a multi-panel modular display, a perimeter of the casing being substantially rectangular and having a height and a width, wherein the height is half of the width. The display panel may further include a printed circuit board disposed in the recess, a display surface including an array of light emitting diodes (LEDs) attached to a front side of the printed circuit board, and a back surface including a sealed back cover enclosing the recess and contacting a peripheral region of the casing defining the recess, the sealed back cover being configured to provide a watertight seal for the recess. The display panel may further include a power supply unit disposed within the casing and physically coupled to the sealed back cover, there being no direct physical connection between the power supply unit and the first printed circuit board or the casing, the sealed back cover being configured to dissipate heat generated by the power supply unit.

In an embodiment, a modular digital display system may include a mechanical support structure including a plurality of vertical beams and a plurality of horizontal beams, and a plurality of digital display panels mounted to the mechanical support structure so as to form an integrated display panel. The integrated display panel may include a display surface, wherein the mechanical support structure is configured to provide mechanical support to the plurality of digital display panels. Each of the plurality of digital display panels may include a housing including a recess, a substrate disposed in the recess, a plurality of light emitting diodes (LEDs) attached to a front side of the substrate, the plurality of LEDs forming a front surface of the digital display panel, and a back cover enclosing the recess and a back side of the substrate, the back cover forming a back surface of the display panel, the back cover being devoid of vents through a thickness of the back cover that ventilate the recess. Each of the plurality of digital display panels may further include a power supply unit disposed within the recess and physically attached to the back cover and not to the substrate, the back cover being configured to dissipate heat generated by the power supply unit.

BRIEF DESCRIPTION OF THE DRAWINGS

For a more complete understanding of the present invention, and the advantages thereof, reference is now made to the following descriptions taken in conjunction with the accompanying drawings, in which:

FIG. 6A illustrates a front view of a panel with illumination elements arranged in a 16×32 configuration, in accordance with an embodiment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

This disclosure provides many applicable inventive concepts that can be embodied in a wide variety of specific contexts. The specific embodiments discussed are merely illustrative of specific ways to make and use the invention, and do not limit the scope of the invention.

In the following embodiments, exterior displays are used herein for purposes of example. It is understood that the present disclosure may be applied to lighting for any type of interior and/or exterior display.

Figure 1A:
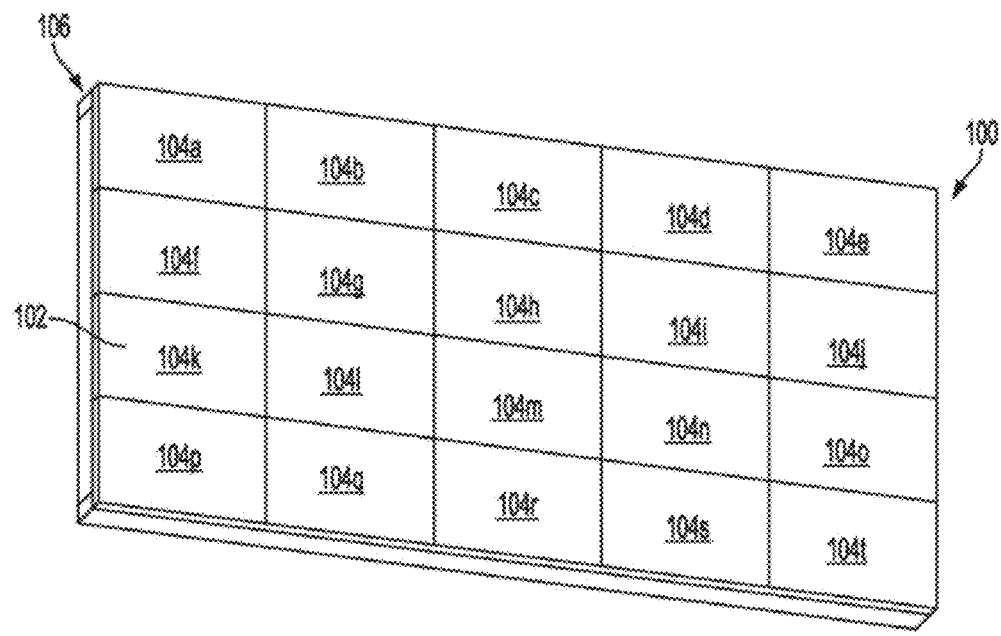
FIGS. 1A and 1B respectively illustrate a front-view and a back-view of a multi-panel display, in accordance with an embodiment.
Figure 1B:
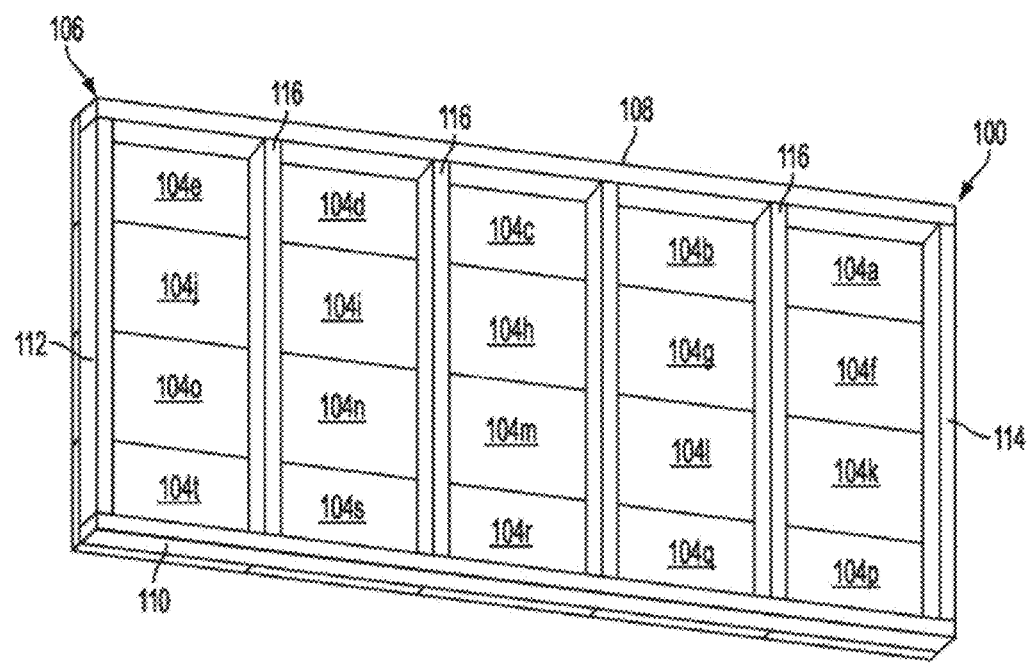

FIGS. 1A and 1B respectively illustrate a front-view and a back-view of a multi-panel display 100, in accordance with an embodiment. The multi-panel display 100 (hereinafter referred to as a "display") includes a display surface 102 formed by a plurality of lighting panels 104a-104t (hereinafter referred to as a "panels 104") arranged as an array of panels 104. Each panel 104 of each row of the array of panels 104 is electrically connected to an adjacent panel 104 within that row. In the present embodiment, the panels 104 use light emitting diodes (LEDs) for illumination; however, other light sources may be used in other embodiments. The panels 104 typically operate together to form a single image across the display surface 102, although multiple images may be simultaneously displayed by the display 100. In the present example, each of the panels 104 is attached to a frame 106 (e.g. shown in FIG. 1B), which enables each of the panels 104 to be installed or removed from the display 100 without affecting other panels 104.

In the display 100 of FIGS. 1A and 1B, each panel 104 is a self-contained unit that couples directly to the frame 106. By "directly," it is understood that another component or components may be positioned between the panel 104 and the frame 106, but the panel 104 is not placed inside weather protection cabinetry that is coupled to the frame 106. For example, an alignment plate may be coupled to a panel 104 and/or the frame 106 to aid in aligning a panel 104 with other panels 104. Further a corner plate could be used. The panel 104 may then be coupled to the frame 106 or the alignment plate and/or corner plate, and either coupling approach would be "direct" according to the present disclosure.

A first panel 104 can be coupled, for power and/or data purposes, with a second panel 104 that receives power and/or data from a central source or a third panel 104. The second panel 104 may also pass through at least some of the power and/or data to a fourth panel 104. This further improves the modular aspect of the display 100, since a single panel 104 can be easily installed in the display 100 by coupling the power and data connections of the single panel 104 to neighboring panels 104. Similarly, a single panel 104 can be easily disconnected from the display 100 by decoupling the power and data connections of the single panel 104 from neighboring panels 104.

The power and data connections for the panels 104 may be configured using one or more layouts, such as a ring, mesh, star, bus, tree, line, or fully-connected layout, or a combination thereof. In some embodiments the panels 104 may be in a single network, while in other embodiments the panels 104 may be divided into multiple networks. Power and data may be distributed using identical or different layouts. For example, power may be distributed in a line layout, while data may use a combination of line and star layouts.

The frame 106 that supports the panels 104 may be relatively light in weight compared to frames needed to support cabinet-mounted LED assemblies. In the present example, the frame 106 includes a top horizontal member 108, a bottom horizontal member no, a left vertical member 112, a right vertical member 114, and intermediate vertical members 116, as illustrated in FIG. 1B. Power cables and data cables (not shown in FIGS. 1A-1B) for the panels 104 may route around and/or through the frame 106.

In one embodiment, the display 100 includes 336 panels 104 to create a 14 feet×48 feet display 100. In such an embodiment, the entire display 100 could be built to weigh only 5500 pounds. This compares favorably to commercially available displays of similar size, which generally weigh from 10,000 to 12,000 pounds. In another embodiment, the display 100 includes 320 panels 104 arranged in ten rows and thirty-two columns to create an approximately 16 feet×50 feet display 100.

Figure 2A:
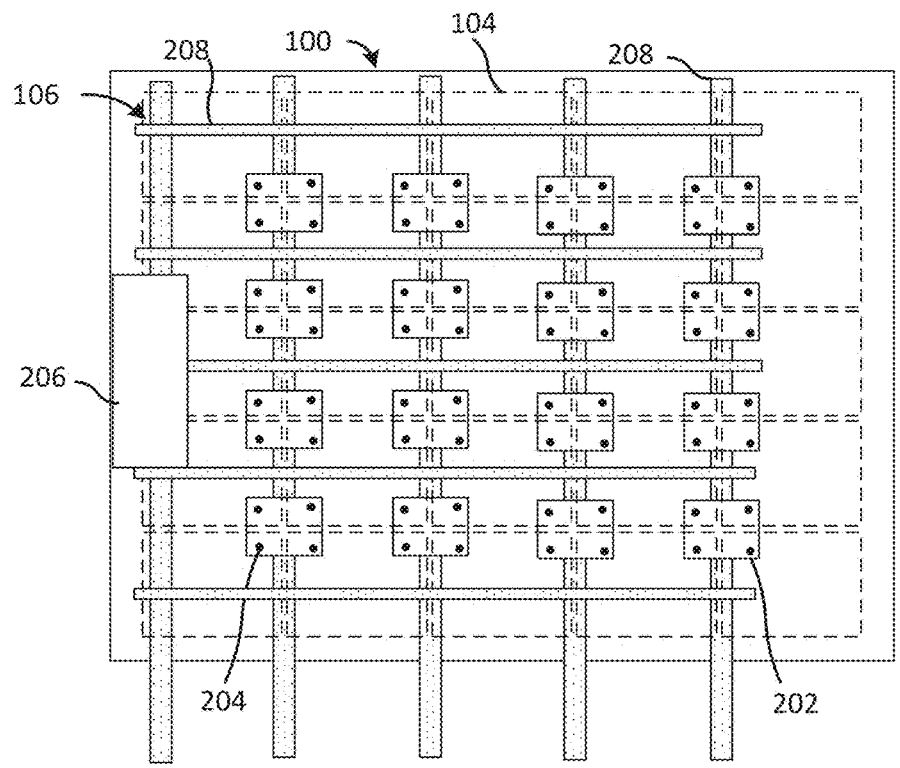
FIGS. 2A-2D illustrate back-views of panels attached to a frame of a multi-panel display, in accordance with various embodiments.

FIGS. 2A-2D illustrate back-views of panels 104 attached to the frame 106 of the display 100, in accordance with various embodiments. As depicted in FIG. 2A, the panels 104 are stacked next to and/or above each other (e.g. as an array) and are securely attached to the frame 106 using an attachment plate 202, which may be a corner plate. The attachment plate 202 may include holes through which attachment features 204 may be disposed. FIG. 2A shows a data receiver box 206 mounted or secured to frame 106. The data receiver box 206 is configured to provide power, data, and communication to the panels 104. With a shared receiver box 206, the panels 104 themselves do not need a respective or individual receiver card, and such a configuration can save cost and weight.

Figure 2B:
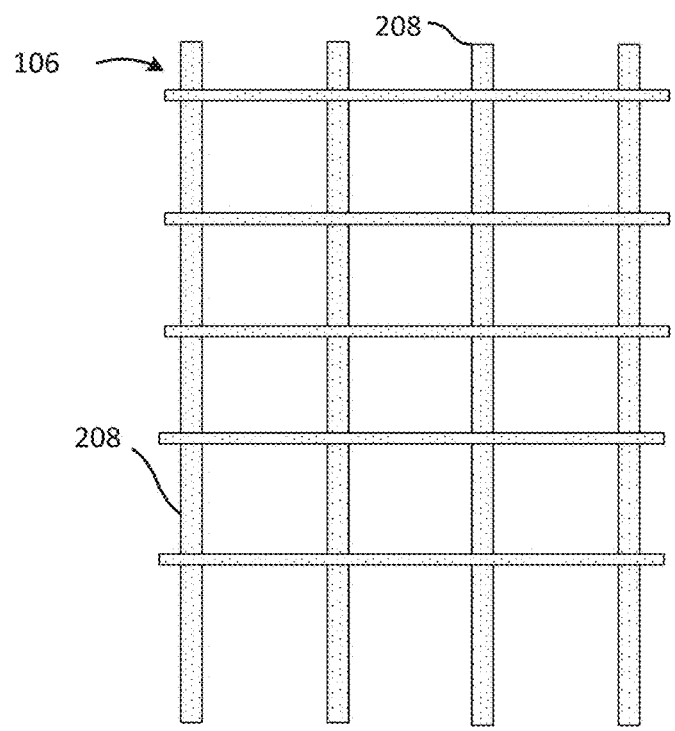

Referring to FIG. 2B, the frame 106 provides mechanical support and electrical connectivity to each of the panels 104. The frame 106 includes a plurality of beams 208 forming the mechanical structure. The frame 106 of FIG. 2B includes a top bar, a bottom bar, a left bar, and a right bar, which demarcate the outer boundary of the frame 106. The frame 106 also includes a plurality of vertical bars extending from the top bar to the bottom bar and disposed between the left bar and the right bar. The top bar, the bottom bar, the left bar and the right bar may be 4" aluminum bars and the vertical bars may be 2"×4"×½" aluminum tubes. The top bar, the bottom bar, the left bar and the right bar may each be capable of bearing a load of 1.738 lb./ft., and the vertical bars may each be capable of bearing a load of 3.23 lb./ft.

The frame 106 may include support structures for the electrical cables, data cables, electrical power box powering the panels 104. The frame 106 does not include any additional enclosures to protect the panels 104, the data cables, or the power cables from the environment. Rather, the frame 106 is exposed to the elements and further exposes the panels 104 to the environment. The frame 106 also does not include air conditioning, fans, heating units to maintain the temperature of the panels 104. Rather, each of the panels 104 is hermetically sealed and is designed to be exposed to the outside ambient. Further, in various embodiments, there are not additional weather protection cabinetry that are attached to the frame 106 or used for housing the panels 104. Accordingly, in various embodiments, the display 100 is designed to be passively cooled.

Figure 2C:
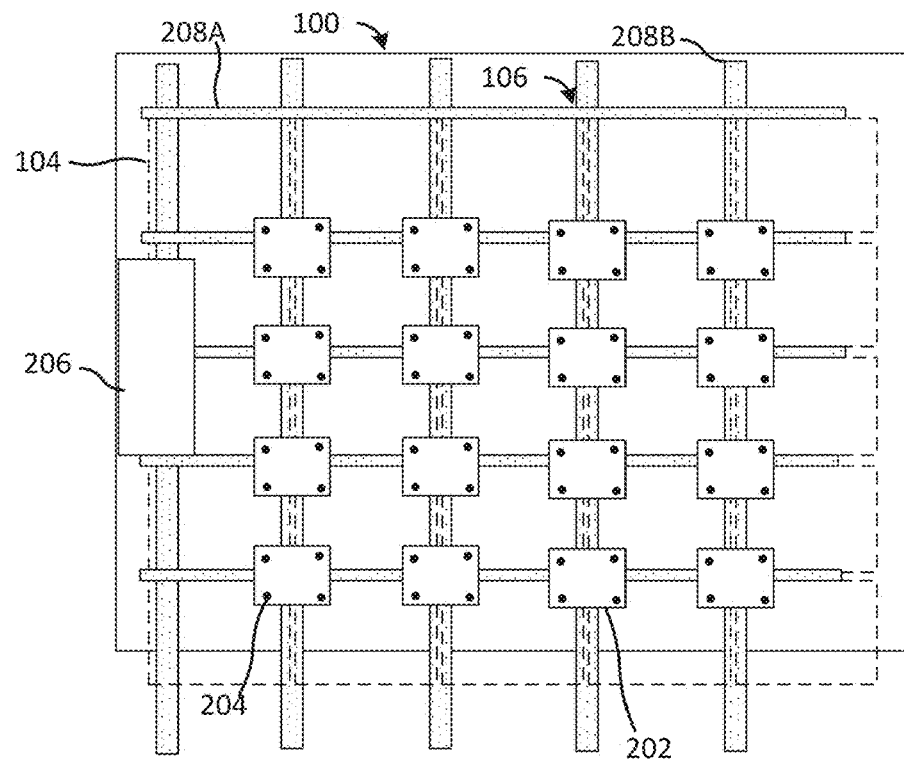
Figure 2D:
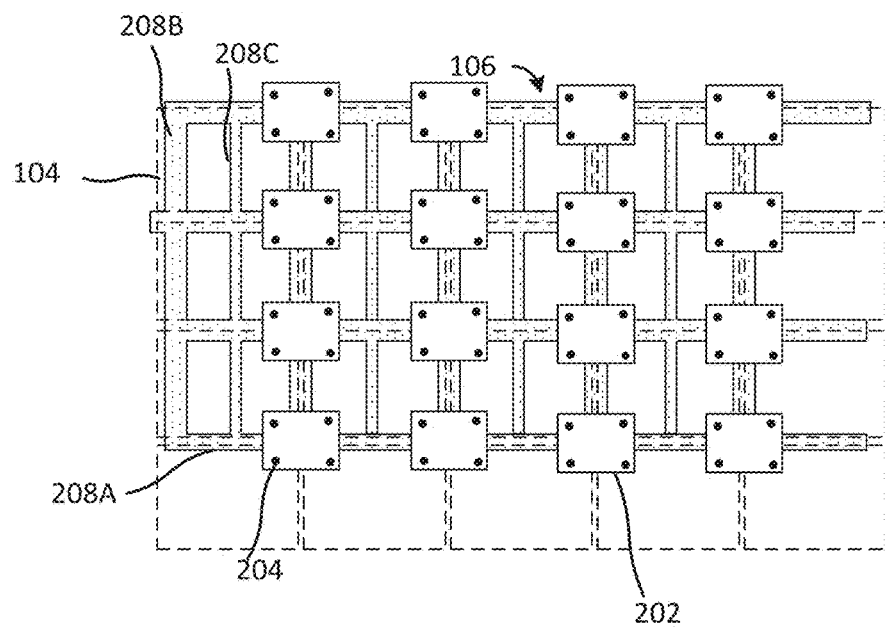

FIGS. 2C and 2D illustrate alternative embodiments of the display 100 attached to the frame 106. The embodiment shown in FIG. 2C differs from embodiment described in FIG. 2A in that the horizontal beams 208A shown in FIG. 2C may be used to support the panels 104. In one embodiment, both horizontal beams 208A and vertical beams 208B may be used to support the panels 104. In another embodiment, horizontal beams 208A but not the vertical beams 208B may be used to support the panels 104, although the vertical beams 208B may be used to reinforce the frame 106 rather than directly support the panels 104. The embodiment shown in FIG. 2D shows that the frame 106 may include additional beams 208C, which may be narrower in width than the other beams of the frame 106. One or more of the thinner beams 208C may be placed between the regular sized vertical beams 208B, e.g., to reinforce the frame 106.

Figure 3A:
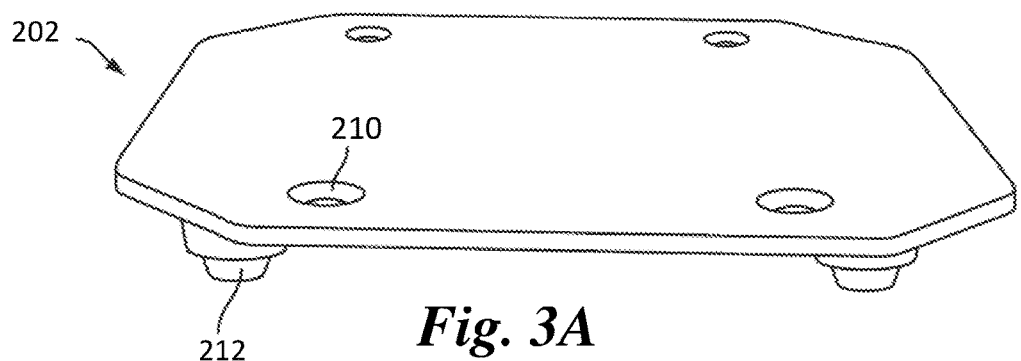
FIGS. 3A-3C show various views of an attachment plate that may attach one or more panels to a frame of a multi-panel display, in accordance with an embodiment.
Figure 3B:
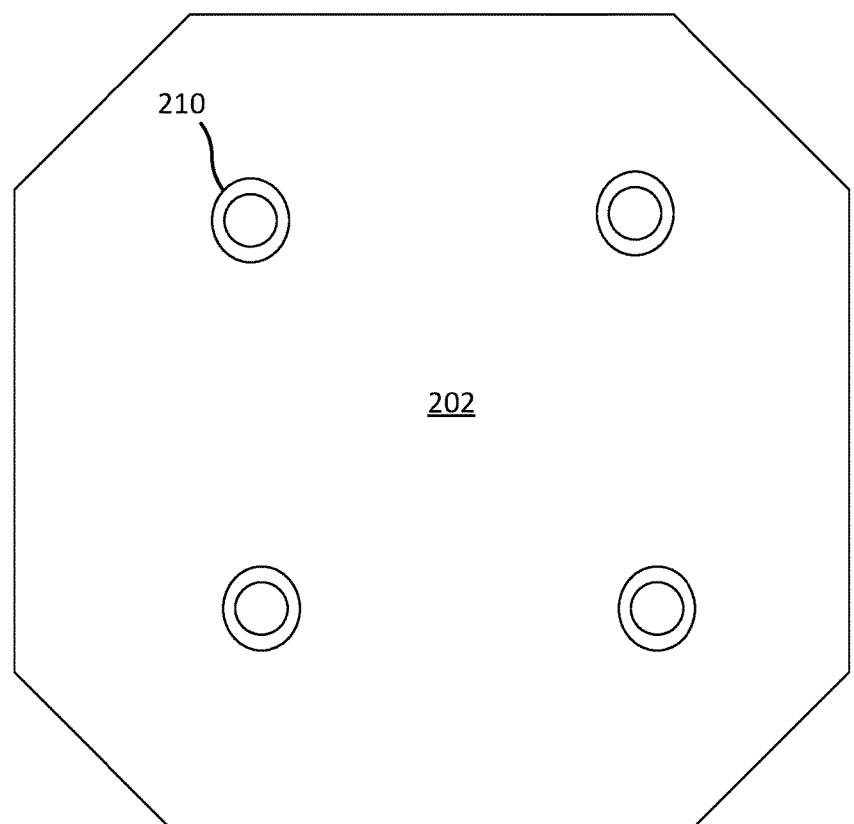
Figure 3C:
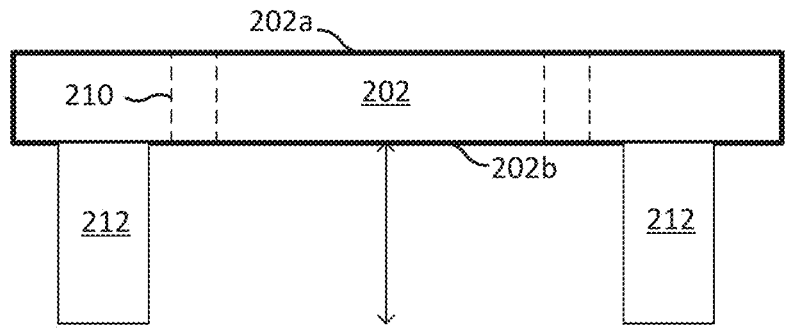

FIGS. 3A-3C show various views of the attachment plate 202 that may attach one or more panels 104 to the frame 106, in accordance with an embodiment. FIG. 3A illustrates a projection view, FIG. 3B illustrates a top view, and FIG. 3C illustrates a cross-sectional view. As shown in FIGS. 3A-3C, the attachment plate 202 may include one or more through openings 210 for enabling attachment features 204 such as screws to go through. Referring to FIG. 3C, the attachment plate 202 includes a top surface 202*a* and a bottom surface 202*b*. The height of the pillars 212 of the attachment plate 202 may be adjusted to provide a good fit for the panel 104 to which the attached plate 202 is secured. Advantageously, because the frame 106 is not screw-mounted to the panel 104, the panel 104 may be moved during mounting. This allows for improved alignment of the panels 104 resulting in improved picture output. An alignment plate could also be used as described above. In various embodiments, the height of the pillars 212 of the attachment plate 202 is substantially equal to the thickness T of the beams 208 of the frame 106. In one or more embodiments, the height of the pillars 212 may be slightly more than the thickness of the beams 208 of the frame 106.

Figure 4:
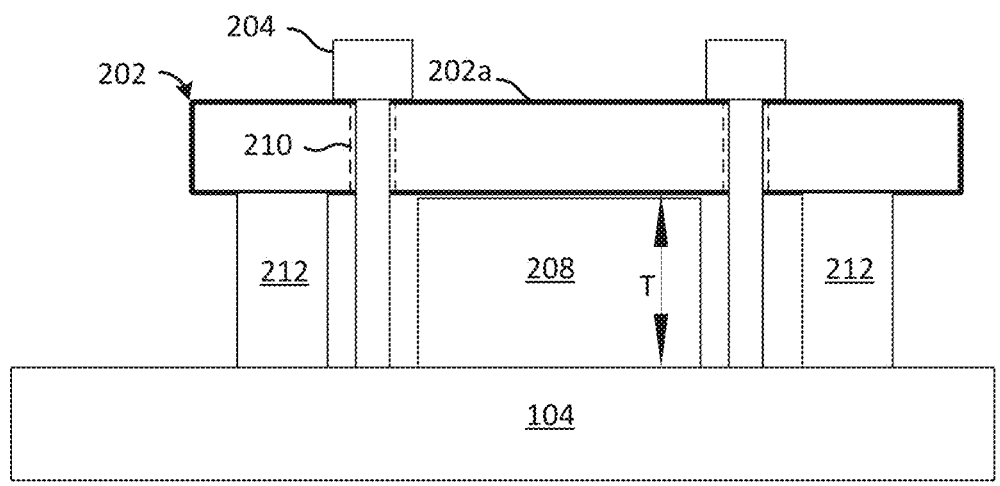
FIG. 4 illustrates a magnified view of an attachment plate, a beam of a frame of a multi-panel display, and a panel after mounting the panel to the frame using the attachment plate, in accordance with an embodiment.

FIG. 4 illustrates a magnified view of the attachment plate 202, a beam 208 of the frame 106, and panel 104 after mounting the panel 104 to the frame 106 using the attachment plate 202, in accordance with an embodiment. As mentioned above, the attachment feature 204 may be used to connect the attachment plate 202 to the panel 104. In the embodiment illustrated in FIG. 4, the attachment plate 202 is a corner plate, which is mechanically connected to corners of four of the panels 106 to secure the panels 106 to the respective beams 208 of the frame 106. The corner plate configuration of the attachment plate 202 is also illustrated in FIGS. 2A, 2C, and 2D, described above. The attachment feature 204 is attached using the through opening 210 in the attachment plate 202. The beam 208 of the frame 106 is disposed between the attachment plate 202 and the panel 104, as shown in FIG. 4.

In the embodiment of FIG. 4, the beam 208 physically contacts the panel 104. In another embodiment, a second plate (not shown here) could be included between the beam 208 and the panel 104. The attachment plate 202 could be a solid material such as a metal plate or could be a conforming material such as a rubber material embedded with metal particles. In either case, it is desirable that the plate be thermally conductive.

As discussed above in connection with FIGS. 1A-1B, each panel 104 of each row of the array of panels 104 is electrically connected to an adjacent panel 104 within that row. This may be accomplished using the embodiment shown in FIGS. 5A-5C.

Figure 5A:
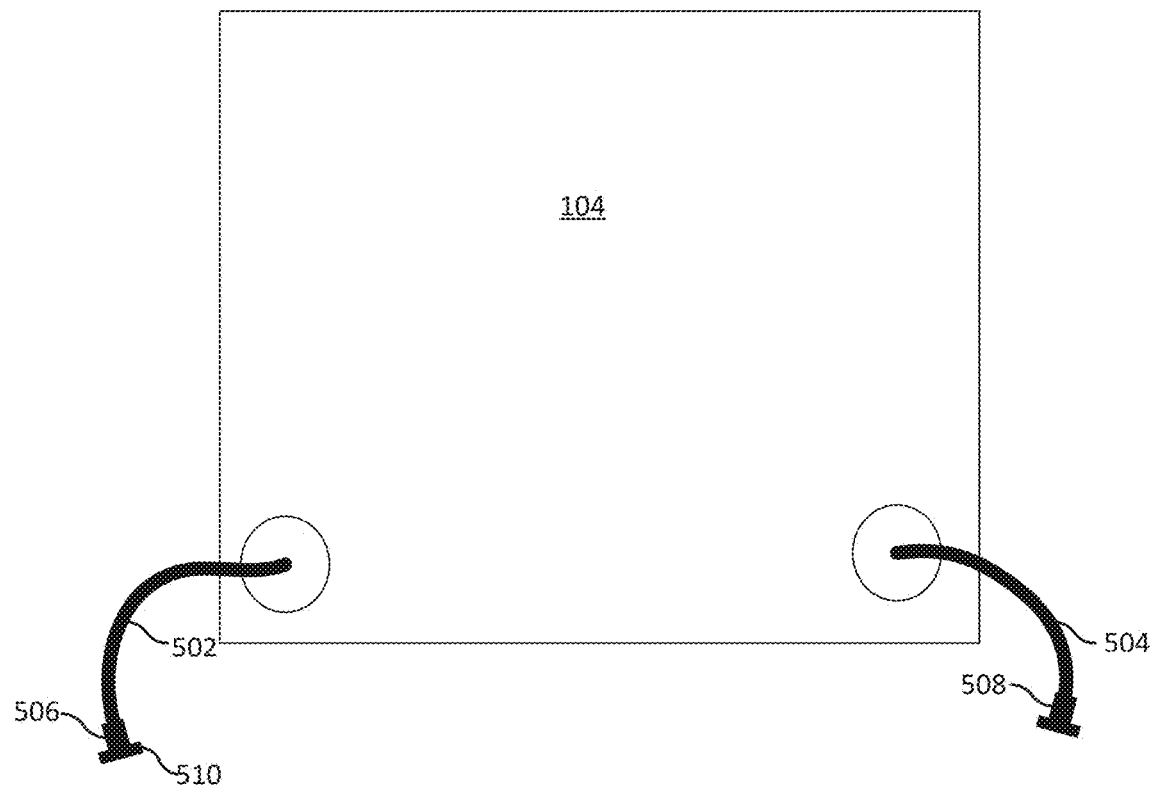
FIG. 5A illustrates one panel including an input cable and an output cable, in accordance with an embodiment.

FIG. 5A illustrates one panel 104 including an input cable 502 and an output cable 504, in accordance with an embodiment. The panels 104 of the display 100 are electrically connected together for data and/or power using the input cable 502 and the output cable 504. As an example, for a given row of panels 104 of the display 100, a panel 104 is capable of receiving input using an integrated data and power cable from a preceding panel 104 and providing an output using another integrated data and power cable to a succeeding panel 104. Each cable ends with an endpoint device or connector, which is a socket or plug.

As shown in FIG. 5A, the panel 104 includes the input cable 502, the output cable 504, a first connector 506, a second connector 508, and a sealing cover 510. The sealing cover 510 of the panel 104 is configured to go over the second connector 508 of a preceding panel 104, thereby hermetically sealing both ends (first connector 506 of the panel 104 and the second connector 508 of the preceding panel 104). The sealing cover 510, which also includes a locking feature, locks the two cables together securely. The input cable 502 and the output cable 504 may include integrated data and power wires with appropriate insulation separating them.

Figure 5B:
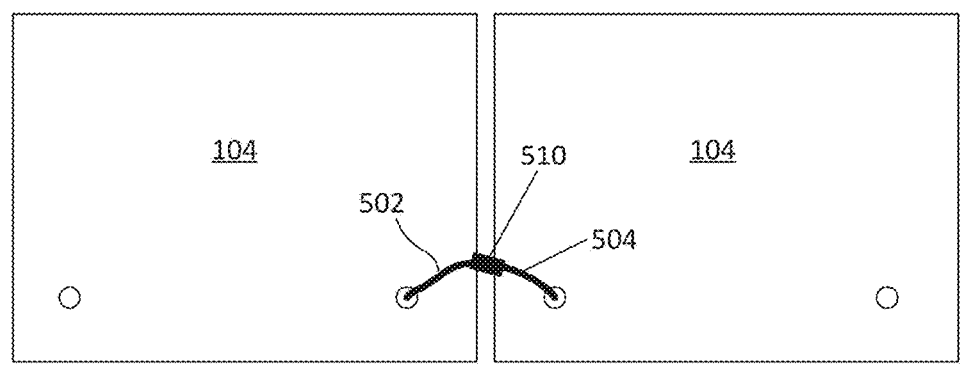
FIG. 5B illustrates two panels next to each other and connected through the cables, in accordance with an embodiment.
Figure 5C:
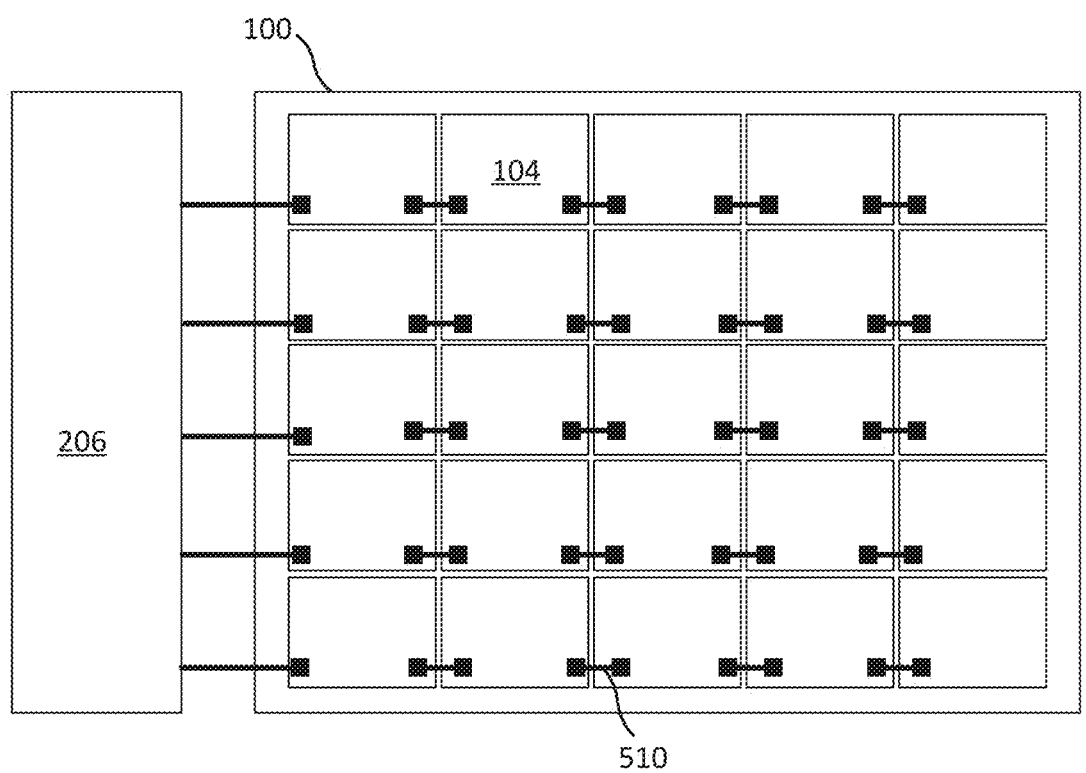
FIG. 5C illustrates a multi-panel display formed by connecting panels together using cables, in accordance with an embodiment.

FIG. 5B illustrates two panels 104 next to each other and connected through the cables, such that the output cable 504 of one panel 104 is connected with the input cable 502 of the next panel 104, in accordance with an embodiment. The sealing cover 510 locks the two cables together as described above. FIG. 5C illustrates the display 100 formed by connecting the panels 104 together using the afore-mentioned cables, in accordance with an embodiment. As shown in FIG. 5C, for each row, a panel 104 at a first end of the row receives an input data connection from a data source (e.g. the data receiver box 206) and has an output data connection to a succeeding panel 104 in the row. Each succeeding panel 104 provides data to a next adjacent panel 104 until the panel 104 at a second end of the row is reached. The power line is run across each row to power the panels 104 in that row.

Figure 6B:
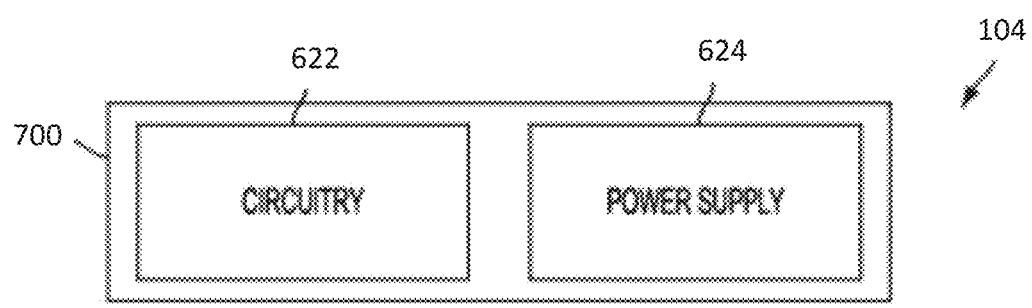
FIG. 6B illustrates a block diagram of internal components within a panel, in accordance with an embodiment.

FIGS. 6A-6B show various aspects of a panel 104, in accordance with an embodiment. FIG. 6A illustrates a front view of the panel 104 with illumination elements (e.g. LEDs) arranged in a 16×32 configuration, in accordance with an embodiment. FIG. 6B illustrates a block diagram of internal components within the panel 104, in accordance with an embodiment.

Referring to the example of FIG. 6A, the panel 104 includes a substrate 602 (e.g. a printed circuit board) that forms a front surface of the panel 104. The panel 104 may have a width W (e.g. between 1 foot and 4 feet) and a height H (e.g. between 0.5 feet to 2 feet), although other dimensions may be possible. In some embodiments, a ratio of the height H to the width W may be about 0.5. The substrate 602 in the present embodiment is rectangular in shape, with a top edge 604, a bottom edge 606, a right edge 608, and a left edge 610.

A substrate surface 612 includes "pixels" 614 that are formed by one or more LEDs 616 on or within the substrate 602. In the present example, each pixel 614 includes four LEDs 616 arranged in a pattern (e.g., a square). For example, the four LEDs 616 that form a pixel 614 may include a red LED, a green LED, a blue LED, and one other LED (e.g., a white LED). In some embodiments, the one other LED may be a sensor. It is understood that more or fewer LEDs 616 may be used to form a single pixel 614, and the use of four LEDs 616 and their relative positioning as a square is for purposes of illustration only.

In some embodiments, the substrate 602 may form the entire front surface of the panel 104, with no other part of the panel 104 being visible from the front when the substrate 602 is in place. In other embodiments, a housing 700 (e.g. shown in FIG. 7) may be partially visible at one or more of the edges of the substrate 602. The substrate 602 may form the front surface of the panel 104, but may not be the outer surface in some embodiments. For example, a transparent or translucent material or coating may overlay the substrate 602 and the LEDs 616, thereby being positioned between the substrate 602/LEDs 616 and the environment.

As one example, a potting material can be formed over the LEDs 616. This material can be applied as a liquid, e.g., while heated, and then harden over the surface, e.g., when cooled. This potting material is useful for environmental protection, e.g., to achieve an IP rating of IP 65 or higher.

Louvers 618 may be positioned between adjacent row of pixels 614 to block or minimize light from directly striking the LEDs 616 from certain angles. For example, the louvers 618 may be configured to extend from the substrate 602 to a particular distance and/or at a particular angle needed to completely shade each pixel 614 when a light source (e.g., the sun) is at a certain position (e.g., ten degrees off vertical). In the present example, the louvers 618 extend the entire length of the substrate 602, but it is understood that other louver configurations may be used.

Referring to FIG. 6B, the block diagram of the panel 104 illustrates the housing 700 containing circuitry 622 that is coupled to the LEDs 616 and is used to control the LEDs 616. In the example shown in FIG. 6B, the panel 104 also includes a power supply 624, which provides power to the LEDs 616 and circuitry 622. However, in other embodiments where the panel 104 receives power from another panel 104, the power supply 624 may not be contained within the housing 700. Data and/or power may be received for only the panel 104, and in such embodiments, the data and/or power received is used to drive and/or power the LEDs 616 of the panel 104. However, in other embodiments, data and/or power may be passed on to one or more other panels 104 as well, and in such embodiments the circuitry 622 and/or power supply 624 may be configured to pass data and/or power to other panels 104 that may be electrically coupled to the panel 104.

Figure 7:
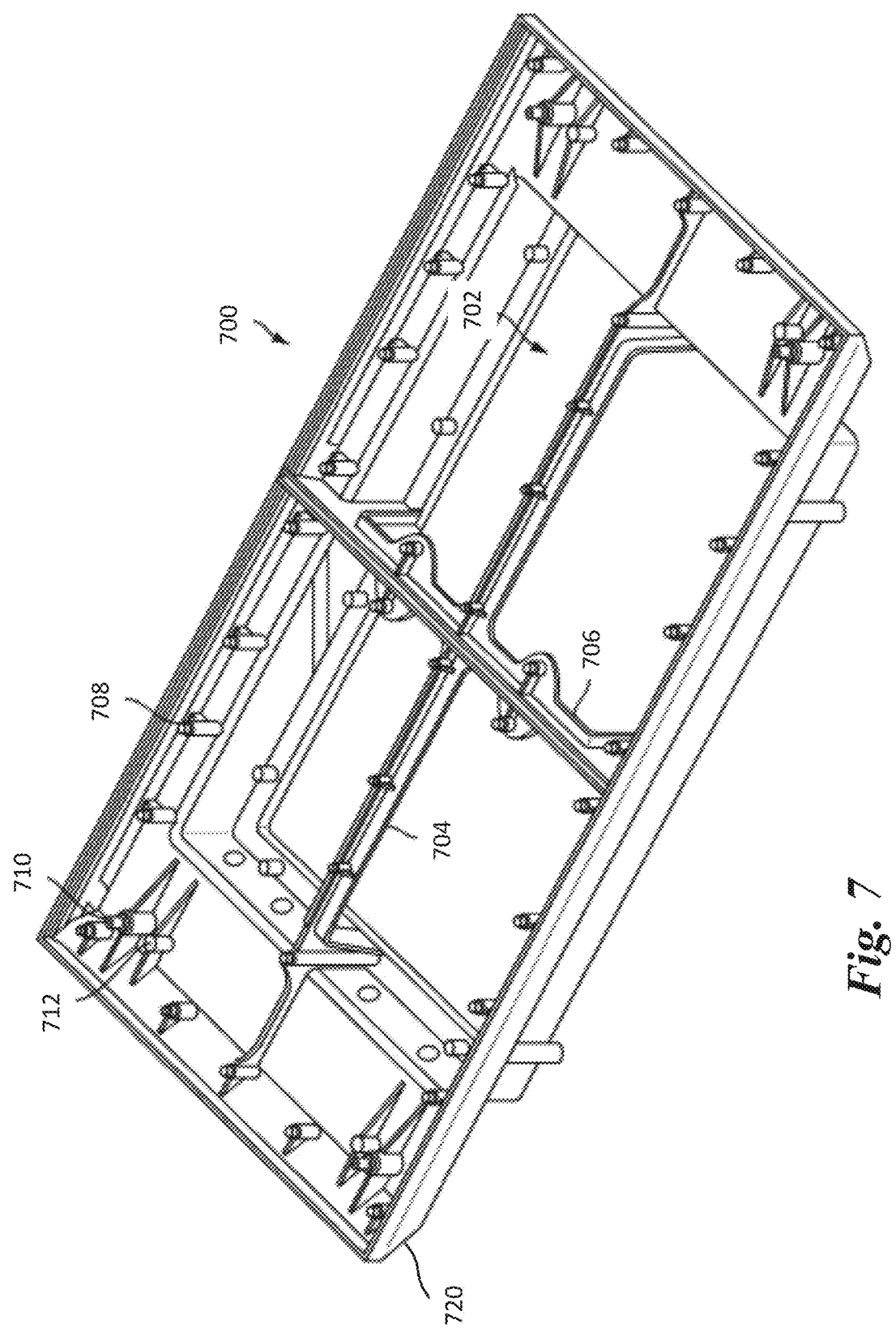
FIG. 7 illustrates a housing that may be contain circuitry and, optionally, a power supply of a panel, in accordance with an embodiment.

FIG. 7 illustrates another view of the housing 700 that may contain the circuitry 622 and, optionally, the power supply 624 of the panel 104 shown in FIG. 6B, in accordance with an embodiment. The housing 700 may also be referred to as a casing and may be made of a thermally conductive material (e.g., aluminum) that is relatively light weight and rigid. In other embodiments, the housing 700 could be made out of industrial plastic, which is even lighter than aluminum. As shown in FIG. 7, the housing 700 defines a cavity 702 (which may also be referred to as a recess). Structural cross-members 704 and 706 may be used to provide support to a substrate (e.g., the substrate 602 of FIG. 6A). The cross-members 704 and 706, as well as other areas of the housing 700, may include supports 708 against which the substrate can rest when placed into position. As shown, the supports 708 may include a relatively narrow tip section that can be inserted into a receiving hole in the back of the substrate and then a wider section against which the substrate can rest.

The housing 700 may also include multiple extensions 710 (e.g., sleeves) that provide screw holes or locations for captive screws that can be used to couple the substrate to the housing 700. Other extensions 712 may be configured to receive pins or other protrusions from the attachment plate 202, which secures the housing 700 to the frame 106, as described above in relation to FIGS. 2A-2D, 3A-3C, and 4. Some or all of the extensions 712 may be accessible only from the rear side of the housing 700 (e.g. through a back cover that defines a back surface of the housing 700 and that encloses the cavity 702) and so are not shown as openings in FIG. 7. As shown in FIG. 7, the housing 700 may include beveled or otherwise non-squared edges 720. This shaping of the edges enables adjacent panels 104 to be positioned in a curved display without having large gaps appear as would occur if the edges were squared.

Figure 8:
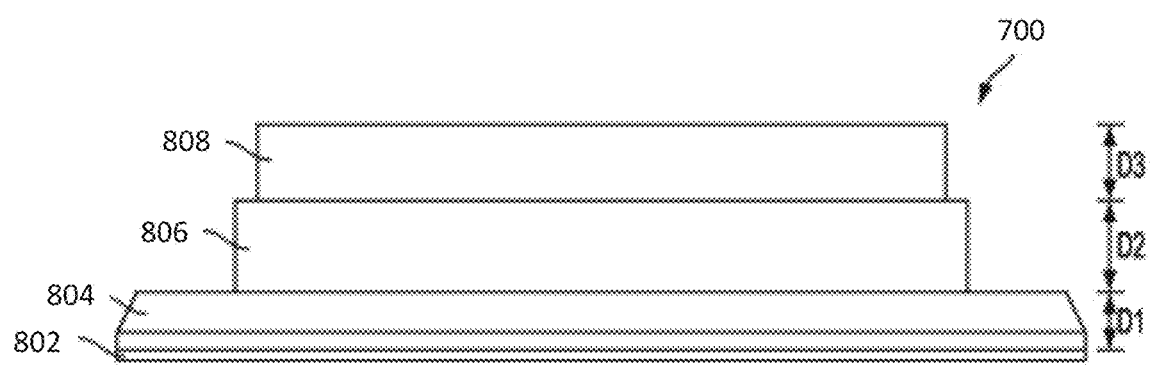
FIG. 8 illustrates a top-down view of a housing of a panel, in accordance with various embodiments.

FIG. 8 illustrates a top-down view of the housing 700 of the panel 106, in accordance with various embodiments. Referring to FIG. 8, the housing 700 includes three sections. The first section 802 includes the LEDs 616 (not shown) and louvers 618. The second section 804 and third section 806 may be used to house the circuitry 622 and power supply 624. In the present example, the third section 806 is an extended section that may exist on main panels, but not slave panels, due to extra components needed by a main panel to distribute data. In this regard, main panels may be identified as panels 104 that intake main power and data supply from an external source, while slave panels may be identified as panels 104 that receive power and data supply from main panels but do not distribute the power and/or data to other panels 104. Depths D1, D2, and D3 correspond to sections 804, 806, and 808, respectively. Depth D1 may be between 1 inch and 4 inches; depth D2 may be between 1 inch and 4 inches; depth D3 may be between 1 inch and 4 inches.

In the example shown in FIG. 7, the housing 700 is devoid of a back cover that ultimately covers the back of the housing 700, e.g., to enclose the cavity 702 and seal the housing 700 to prevent water and dust from entering the housing 700. An example of a back cover that may enclose the cavity 702 of the housing 700 is shown in FIGS. 9A-9B.

Figure 9A:
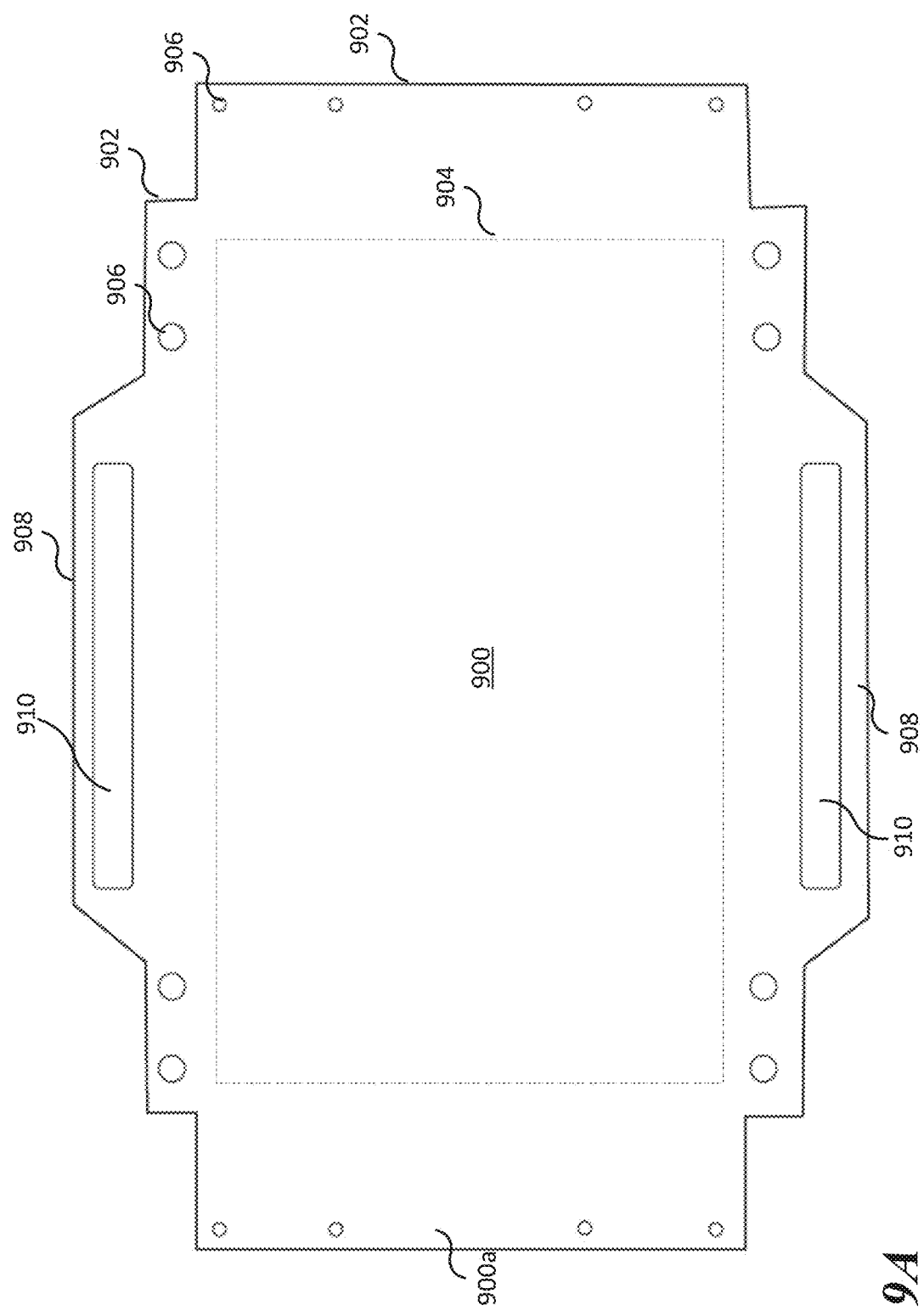
FIG. 9A shows a top-down view of a back cover that may enclose a cavity of a housing, in accordance with an embodiment
Figure 9B:
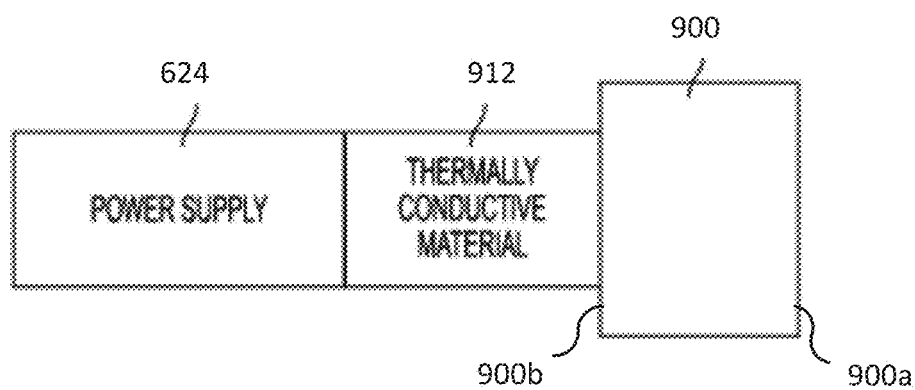
FIG. 9B shows a power supply that is thermally coupled to a back cover via a thermally conductive material, in accordance with an embodiment.

FIG. 9A shows a top-down view of a back cover 900 that may enclose the cavity 702 of the housing 700, in accordance with an embodiment. The back cover 900 includes an outer surface 900a that faces an exterior of the panel 104. In other words, the outer surface 900a is exposed to the outside ambient and the elements. The back cover 900 may include a metal, such as aluminum and may have a thickness between 0.125 inches and 0.375 inches. In some embodiments, the back cover 900 may be manufactured by laser cutting sheets of metal (e.g. aluminum). The back cover 900 allows the housing 700 to be sealed to prevent water from entering the housing 700. For example, the housing 700 may be sealed to have an ingress protection (IP) rating such as IP 67, which defines a level of protection against both solid particles and liquid. This ensures that the panel 104 can be mounted in inclement weather situations without being adversely affected. In other embodiments, the housing 700 may be sealed to have an IP rating of IP 65 or higher, e.g. IP 65, IP 66, IP 67, or IP 68., thus allowing the panel 104 to be waterproof against submersion in up to 3 feet of water. Such ingress protection may also be accomplished by a gasket (not shown in the figures) disposed between the back cover 900 (e.g. a periphery 902 of the back cover 900) and the housing 700 (e.g. a periphery of the housing 700 that defines sidewalls of the cavity 702).

As shown in FIG. 9A, the back cover 900 includes a contiguous central region 904 that covers the cavity 702 of the housing 700. In some embodiments, the back cover 900 may include a plurality of materials, with the contiguous central region 904 of the back cover 900 including a metal inlay (e.g. to allow for thermal conductivity) and other regions of the back cover 900 (e.g. regions of the back cover 900 surrounding the contiguous central region 904) being made of plastic. The back cover 900 additionally includes through-holes 906 that are configured to receive screws, pins, or other protrusions that engage with the extensions 712 of the housing 700 so as to securely attach the back cover 900 to the housing 700. As such, the extensions 712 of the housing 700 may include openings that are accessible only from the rear side of the housing 700. In the example shown in FIG. 9A, the back cover 900 further includes handles 908 defined by slots 910 that facilitate handling of the back cover 900 by a human. It is noted that neither the through-holes 906 nor the slots 910 are disposed over the cavity 702 of the housing 700 and that the cavity 702 is fully covered by the back cover 900, e.g., by the contiguous central region 904 of the back cover 900. Furthermore, the back cover 900 is devoid of vent openings for air intakes or exhausts. This is in contrast to conventional back covers that may include a plastic back or metal door system that facilitates access to the cavity 702 of the housing 700. Such conventional back covers also include a ventilation system to facilitate total system cooling though vent openings. Consequently, such conventional back covers do not create a watertight seal and therefore allow water and dust into the circuitry of the panel 104. The back cover 900 shown in FIG. 9A circumvents these disadvantages by providing a metal back cover that is devoid of vent openings and that fully covers the cavity 702 (thereby preventing water and dust ingress) and that achieves a watertight seal by having a gasket disposed between the back cover 900 (e.g. a periphery 902 of the back cover 900) and the housing 700 (e.g. a periphery of the housing 700 that defines sidewalls of the cavity 702).

In addition to enabling a watertight seal for the housing 700, the back cover 900 can be used as an element that facilitates heat dissipation for the power supply 624 of the panel 104. In such embodiments, the cooling of the panel 104 is passive since there are no vent openings in the back cover 900 for air intakes or exhausts. For example, FIG. 9B shows an embodiment that illustrates how the power supply 624 may be thermally coupled to the back cover 900 via a thermally conductive material 912 (e.g., silicon, a ceramic, or the like) that is disposed between the power supply 624 and an inner surface 900b of the back cover 900 that faces an interior of the panel 104 (e.g. the cavity 702 of the housing 700). In such embodiments, this thermally conductive material 912 may have a thickness of between 0.5 mm and 5 mm, thereby separating the power supply 624 and the inner surface 900b of the back cover 900 by the aforementioned range of distances. This configuration may be particularly relevant since is sealed and cooling is passive. In other embodiments, a metal-to-metal contact or a PCB-to-metal contact may be provided between the power supply 624 and the inner surface 900b of the back cover 900 to ensure a thermal connection to the back cover 900, as described below in connection with FIG. 9C.

In another embodiment, a similar system of passive cooling, e.g., by providing a thermal connection between the back cover 900 and the power supply 624, may be accomplished by using a seal, but thermally conductive plastic. Such an embodiment would include a cut slot for the power supply 624 to fit, a molded slot, or a similar system. A thermally conductive material may also be used in this embodiment to ensure a good thermal connection.

Figure 9C:
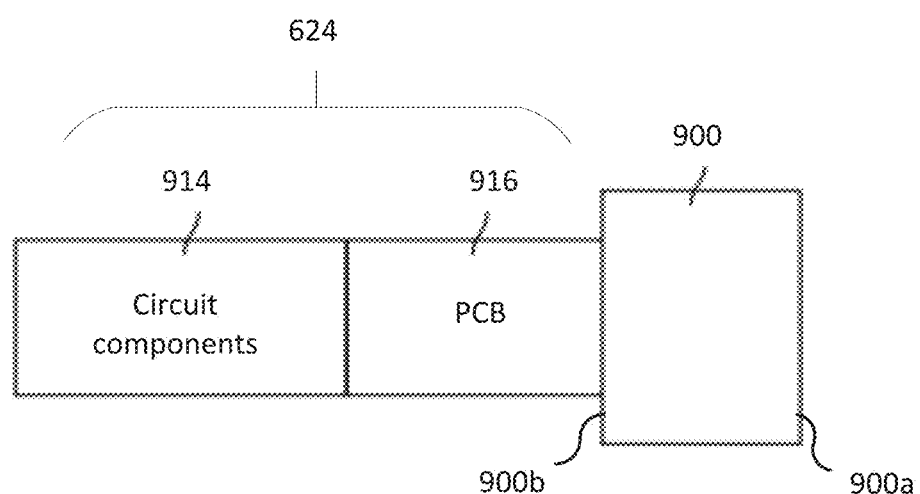
FIG. 9C shows a power supply that is physically coupled to a back cover without an intervening material, in accordance with an embodiment.

Passive cooling of the power supply 624 may also be accomplished by physically contacting the power supply 624 to the inner surface 900b of the back cover 900. Such an embodiment in schematically shown in FIG. 9C, where the power supply 624 includes circuit components 914 disposed over a PCB 916, in which the PCB 916 is in physical contact with the back cover 900, e.g., without an intervening thermally conductive material 912. In the embodiments of FIGS. 9B and 9C, the power supply 624 may be physically coupled to the back cover goo; however, there may be no further physical coupling between the power supply 624 and the housing 700.

In view of the above, the following observations may be made. In an embodiment, a sealed metal cover 900 is provided that facilitates a watertight seal as well as a medium for heat dissipation for the power supply 624. Water ingress can cause panel failures. In an embodiment, by sealing the panel 104 from water ingress, a potential point of failure may be eliminated. In an embodiment, a thin piece of metal (e.g. aluminum or similar metal) is cut into the shape of the back cover 900. This sheet of metal has a system in place to secure the power supply 624 to the inside of the back cover 900. This system allows for the power supply 624 to have a thermal connection to the metal back. This can be facilitated either through metal-to-metal contact or using a thermally conductive material to ensure a connection between the metal back cover 900 and the power supply 624. Embodiments provided herein allow for an entirely sealed panel 104 that still allows for an appropriate amount of thermal conductivity to keep the overall panel 104 cooled.

In an embodiment, a display panel may include a housing including a recess, a substrate disposed in the recess, and a plurality of light emitting diodes (LEDs) attached to a front side of the substrate, in which the plurality of LEDs form a front surface of the display panel. The display panel may further include a back cover enclosing the recess and a back side of the substrate. The back cover may form a back surface of the display panel, and the back cover may be configured to prevent ingress of water or dust through a thickness of the back cover. The display panel may further include a power supply disposed in the recess and physically attached to the back cover and not to the housing or substrate, in which the power supply is configured to power the plurality of LEDs.

In an embodiment, a display panel may include a casing having a recess and attachment points for use in attachment as part of a multi-panel modular display, a perimeter of the casing being substantially rectangular and having a height and a width, wherein the height is half of the width. The display panel may further include a printed circuit board disposed in the recess, a display surface including an array of light emitting diodes (LEDs) attached to a front side of the printed circuit board, and a back surface including a sealed back cover enclosing the recess and contacting a peripheral region of the casing defining the recess, the sealed back cover being configured to provide a watertight seal for the recess. The display panel may further include a power supply unit disposed within the casing and physically coupled to the sealed back cover, there being no direct physical connection between the power supply unit and the first printed circuit board or the casing, the sealed back cover being configured to dissipate heat generated by the power supply unit.

In an embodiment, a modular digital display system may include a mechanical support structure including a plurality of vertical beams and a plurality of horizontal beams, and a plurality of digital display panels mounted to the mechanical support structure so as to form an integrated display panel. The integrated display panel may include a display surface, wherein the mechanical support structure is configured to provide mechanical support to the plurality of digital display panels. Each of the plurality of digital display panels may include a housing including a recess, a substrate disposed in the recess, a plurality of light emitting diodes (LEDs) attached to a front side of the substrate, the plurality of LEDs forming a front surface of the digital display panel, and a back cover enclosing the recess and a back side of the substrate, the back cover forming a back surface of the display panel, the back cover being devoid of vents through a thickness of the back cover that ventilate the recess. Each of the plurality of digital display panels may further include a power supply unit disposed within the recess and physically attached to the back cover and not to the substrate, the back cover being configured to dissipate heat generated by the power supply unit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A display panel, comprising:
    a monolithic structure comprising:
        a first plastic enclosure defining a first recess; and
        a second plastic enclosure extending from a major surface of the first plastic enclosure, the second plastic enclosure defining a second recess, wherein a dimension of the second recess along a lateral direction of the monolithic structure is less than a dimension of the first recess along the lateral direction;
    a printed circuit board (PCB) attached to the first plastic enclosure;
    a plurality of light emitting diodes (LEDs) attached to a front side of the PCB, the plurality of LEDs extending out of the first recess and forming a front-facing surface of the display panel;
    a flat metallic back cover removably attached via securement elements to a periphery of the second plastic enclosure, the flat metallic back cover comprising a flared region overhanging the periphery of the second plastic enclosure, the flat metallic back cover covering the second recess, the flat metallic back cover forming a back-facing surface of the display panel;
    a gasket interposed between the periphery of the second plastic enclosure and a peripheral region of the flat metallic back cover, the flat metallic back cover and the gasket being configured to cooperatively prevent ingress of water or dust into the second recess; and
    a power supply disposed in the second recess and physically attached to a planar surface of the flat metallic back cover directed to the second recess, wherein the power supply is configured to be removed from the second recess through detachment of the flat metallic back cover from the periphery of the second plastic enclosure, wherein the power supply is not directly attached to the monolithic structure or the PCB, the power supply being configured to power the plurality of LEDs, wherein the display panel is configured to be independently operable and cooperatively function with other display panels to form a multi-panel display.

2. The display panel of claim 1, wherein the power supply is physically attached to the planar surface of the flat metallic back cover by a thermally conductive material separate from the power supply.

3. The display panel of claim 2, wherein the flat metallic back cover is further configured to dissipate heat generated by the power supply.

4. The display panel of claim 2, wherein the thermally conductive material is silicon.

5. The display panel of claim 2, wherein the thermally conductive material comprises a ceramic material.

6. The display panel of claim 1, wherein the flat metallic back cover comprises a contiguous central region covering the second recess.

7. The display panel of claim 6, wherein the contiguous central region is devoid of vents that open into the second recess.

8. A display panel, comprising:
    a monolithic body having attachment points for use with other display panels as part of a multi-panel modular display, a perimeter of the monolithic body being substantially rectangular and having a height and a width, the monolithic body comprising:
        a first rectangular compartment defining a first recess;
        a second rectangular compartment extending from a base of the first rectangular compartment and defining a second recess, wherein a width of a mouth of the first recess is greater than a width of a mouth of the second recess;
    a first printed circuit board attached to the first rectangular compartment;
    a display surface comprising an array of light emitting diodes (LEDs) attached to a front side of the first printed circuit board, wherein at least a portion of the array of LEDs extends out of the first recess and forms a front-facing surface of the display panel;
    a back surface comprising a flat sealed back cover detachable from a peripheral region of the second rectangular compartment, the flat sealed back cover comprising a first handle overhanging a first sidewall of the second rectangular compartment, the flat sealed back cover further comprising a second handle opposite the first handle, the second handle overhanging a second sidewall of the second rectangular compartment opposite the first sidewall, the flat sealed back cover being removably attached to the peripheral region of the second rectangular compartment via removable securement elements;
    a gasket lining the peripheral region of the second rectangular compartment and interposed between the peripheral region of the second rectangular compartment and a perimeter of the flat sealed back cover, the flat sealed back cover and the gasket being configured to cooperatively provide a watertight seal for the second recess; and
    a power supply disposed within the second rectangular compartment and physically coupled to the flat sealed back cover, there being no direct physical connection between the power supply and the first printed circuit board, the second rectangular compartment, and the first rectangular compartment, wherein the power supply is configured to be extracted from the second recess through detachment of the flat sealed back cover from the peripheral region of the second rectangular compartment, the flat sealed back cover being configured to dissipate heat generated by the power supply.

9. The display panel of claim 8, wherein the monolithic body is made only of plastic.

10. The display panel of claim 8, wherein the monolithic body is made only of aluminum.

11. The display panel of claim 8, wherein the flat sealed back cover is devoid of openings disposed over the second recess.

12. The display panel of claim 8, wherein a thickness of the flat sealed back cover is between 0.125 inches and 0.375 inches.

13. The display panel of claim 8, wherein the flat sealed back cover comprises a metal.

14. The display panel of claim 13, wherein the flat sealed back cover comprises a central contiguous region comprising the metal and overlying the second recess.

15. The display panel of claim 14, wherein the flat sealed back cover further comprises a peripheral region surrounding the central contiguous region, the peripheral region comprising a plastic, and wherein the first handle and second handle flare out from the peripheral region of the flat sealed back cover.

16. The display panel of claim 8, wherein the power supply comprises a second printed circuit board in physical contact with the flat sealed back cover.

17. The display panel of claim 8, wherein the power supply is physically attached to a planar surface of the flat sealed back cover by a thermally conductive material.

18. The display panel of claim 17, wherein the thermally conductive material is silicon.

19. The display panel of claim 17, wherein the thermally conductive material is a ceramic material.

20. A modular digital display system, comprising:
a mechanical support structure comprising a plurality of vertical beams and a plurality of horizontal beams; and
a plurality of digital display panels mounted to the mechanical support structure so as to form an integrated display panel, the integrated display panel comprising a display surface, wherein the mechanical support structure is configured to provide mechanical support to the plurality of digital display panels, wherein each of the plurality of digital display panels comprises:
a monolithic structure comprising:
 a first plastic enclosure defining a first recess; and
 a second plastic enclosure extending from a flat surface of the first plastic enclosure, the second plastic enclosure defining a second recess, wherein a dimension of the second recess along a lateral direction of the monolithic structure is less than a dimension of the first recess along the lateral direction;
a first printed circuit board (PCB) attached to the first plastic enclosure;
a plurality of light emitting diodes (LEDs) attached to a front side of the first PCB, the plurality of LEDs extending out of the first recess;
a flat metallic back cover removably attached via securement elements to a periphery of the second plastic enclosure, the flat metallic back cover comprising a first handle overhanging a first side of the periphery of the second plastic enclosure, the flat metallic back cover comprising a second handle overhanging a second side of the periphery of the second plastic enclosure opposite the first side, the flat metallic back cover covering the second recess;
a gasket interposed between the periphery of the second plastic enclosure and a peripheral region of the flat metallic back cover, the flat metallic back cover and the gasket being configured to cooperatively prevent ingress of water or dust into the second recess; and
a power supply disposed in the second recess and physically attached to a planar surface of the flat metallic back cover directed to the second recess, wherein the power supply is configured to be removed from the second recess through detachment of the flat metallic back cover from the periphery of the second plastic enclosure, wherein the power supply is not directly attached to the monolithic structure or the first PCB, the power supply being configured to power the plurality of LEDs.

21. The modular digital display system of claim 20, wherein a thickness of the flat metallic back cover is between 0.125 inches and 0.375 inches.

22. The modular digital display system of claim 20, wherein the flat metallic back cover is aluminum.

23. The modular digital display system of claim 22, wherein the flat metallic back cover comprises a central contiguous region disposed between the first handle and the second handle, the central contiguous region having a same size as the second recess.

24. The modular digital display system of claim 20, wherein the power supply further comprises a second printed circuit board in physical contact with the flat metallic back cover.

25. A display panel, comprising:
a monolithic body having attachment points for use with other display panels as part of a multi-panel modular display, a perimeter of the monolithic body being substantially rectangular and having a height and a width, the monolithic body comprising:
 a first rectangular compartment defining a first recess;
 a second rectangular compartment extending from a base of the first rectangular compartment and defining a second recess, wherein a width of a mouth of the first recess is greater than a width of a mouth of the second recess;
a first printed circuit board attached to the first rectangular compartment;
a display surface comprising an array of light emitting diodes (LEDs) attached to a front side of the first printed circuit board, wherein at least a portion of the array of LEDs extends out of the first recess and forms a front-facing surface of the display panel;
a flat sealed back cover made of a metal and being detachable from a peripheral region of the second rectangular compartment, the flat sealed back cover comprising a first handle overhanging a first sidewall of the second rectangular compartment, the flat sealed back cover further comprising a second handle opposite the first handle, the second handle overhanging a second sidewall of the second rectangular compartment opposite the first sidewall, the flat sealed back cover being removably attached to the peripheral region of the second rectangular compartment via removable securement elements;
a gasket lining the peripheral region of the second rectangular compartment and interposed between the peripheral region of the second rectangular compartment and a perimeter of the flat sealed back cover, the flat sealed back cover and the gasket being configured to cooperatively provide a watertight seal for the second recess;

a power supply disposed within the second rectangular compartment and physically coupled to the flat sealed back cover, there being no direct physical contact between the power supply and the first printed circuit board, the second rectangular compartment, and the first rectangular compartment, wherein the power supply is configured to be extracted from the second recess through detachment of the flat sealed back cover from the peripheral region of the second rectangular compartment, the flat sealed back cover being configured to dissipate heat generated by the power supply; and a second printed circuit board disposed in the power supply and being in physical contact with the flat sealed back cover.

* * * * *